United States Patent
Kato (10) Patent No.: US 8,711,643 B2
(45) Date of Patent: Apr. 29, 2014

(54) MEMORY INTERFACE CIRCUIT, MEMORY INTERFACE METHOD, AND ELECTRONIC DEVICE

(75) Inventor: Yoshiharu Kato, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 133 days.

(21) Appl. No.: 13/300,033

(22) Filed: Nov. 18, 2011

(65) Prior Publication Data

US 2012/0163101 A1 Jun. 28, 2012

(30) Foreign Application Priority Data

Dec. 27, 2010 (JP) ................................ 2010-289410

(51) Int. Cl.
*G11C 7/00* (2006.01)
(52) U.S. Cl.
USPC . 365/193; 365/189.05; 365/194; 365/233.13; 365/233.16
(58) Field of Classification Search
USPC ............... 365/194, 193, 233, 233.13, 233.16, 365/189.05
See application file for complete search history.

(56) References Cited

U.S. PATENT DOCUMENTS

| | | | | |
|---|---|---|---|---|
| 6,775,190 B2 * | 8/2004 | Setogawa | ...................... | 365/193 |
| 7,266,022 B2 * | 9/2007 | Aoki | ......................... | 365/189.05 |
| 7,321,525 B2 * | 1/2008 | Matsui | ...................... | 365/233.12 |
| 7,414,899 B2 * | 8/2008 | Oh et al. | ...................... | 365/193 |
| 7,733,716 B2 * | 6/2010 | Mizutani | ...................... | 365/193 |
| 7,907,471 B2 * | 3/2011 | Murakami | .................. | 365/233.1 |
| 2007/0058479 A1 | 3/2007 | Matsui | | |
| 2008/0036521 A1 | 2/2008 | Kogishi et al. | | |
| 2008/0094918 A1 | 4/2008 | Fujizoe | | |
| 2008/0225612 A1 | 9/2008 | Sugamoto | | |
| 2008/0291757 A1 | 11/2008 | Mizutani | | |
| 2009/0154257 A1 | 6/2009 | Fujioka et al. | | |
| 2009/0289684 A1 | 11/2009 | Kashiwagi | | |
| 2010/0124131 A1 | 5/2010 | Onishi | | |
| 2012/0163104 A1 | 6/2012 | Onishi | | |
| 2013/0329504 A1 | 12/2013 | Onishi | | |

FOREIGN PATENT DOCUMENTS

| | | |
|---|---|---|
| CN | 101266830 A | 9/2008 |
| CN | 101465151 A | 6/2009 |
| JP | 2007-109203 A | 4/2007 |
| JP | 2010-122842 A | 4/2007 |
| JP | 2008-042719 A | 2/2008 |
| JP | 2008-103013 A | 5/2008 |
| JP | 2008-293279 A | 12/2008 |
| JP | 2009-284042 A | 12/2009 |
| JP | 2010-122842 A | 6/2010 |

OTHER PUBLICATIONS

Chinese Office Action dated Jan. 16, 2014 issued from Chinese Application No. 201110402723.0, 13 pages.
Chinese Office Action dated Feb. 18, 2014 issued from Chinese Application No. 2010-289410.
Japanese Office Action dated Feb. 18, 2014 issued in Japanese Application No. 2010-289410.

* cited by examiner

Primary Examiner — Pho M Luu
(74) Attorney, Agent, or Firm — Arent Fox LLP (57) ABSTRACT

A memory interface circuit includes a gating circuit that starts detection of a logic level of a data strobe signal in accordance with a data read command. A clamp circuit clamps the data strobe signal to a first logic level after the data read command is issued. A detection circuit detects a logic level of the data strobe signal, which is driven by the memory, in accordance with the data read command.

14 Claims, 8 Drawing Sheets

MEMORY INTERFACE CIRCUIT, MEMORY INTERFACE METHOD, AND ELECTRONIC DEVICE

CROSS-REFERENCE TO RELATED APPLICATIONS

This application is based upon and claims the benefit of priority from prior Japanese Patent Application No. 2010-289410, filed on Dec. 27, 2010, the entire contents of which are incorporated herein by reference.

FIELD

The present embodiment relates to a memory interface circuit, a memory interface method, and an electronic device.

BACKGROUND

A DDR-SDRAM is a memory that outputs data at both rising and falling edges of a clock. The DDR-SDRAM outputs a read data signal and a data strobe signal, which is synchronized with the read data signal. The memory interface circuit, which is a request origin of data transfer, refers to the rising edge and the falling edge of the data strobe signal to accurately retrieve the read data signal.

When starting the reading of data, a data strobe line for transmitting the data strobe signal is in a high impedance state during a period in which data is not output from the DDR-SDRAM. After a data read command is input, the data strobe line is set to a low level one cycle prior to when data is output from the memory. Such a low level period is referred to as a preamble period.

A delay circuit is used to divide the data strobe signal into a plurality of data strobe signals having different delay widths. This obtains a plurality of data strobe signals having different input timings. An L period detection circuit distinguishes the phase of the data strobe signals, which are delayed differently by the delay circuit. Further, when the data strobe signal has a low level for a period of one cycle, the L period detection circuit detects the low level period as the preamble period. Japanese Laid-Open Patent Publication No. 2008-293279 describes such a technique for detecting the preamble period of the data strobe signal.

If an internal circuit retrieves the read data signal when the data strobe signal has high impedance, the internal circuit may function erroneously.

SUMMARY

According to one aspect, a memory interface circuit includes a gating circuit that starts detection of a logic level of a data strobe signal in accordance with a data read command. A clamp circuit clamps the data strobe signal to a first logic level after the data read command is issued. A detection circuit detects a logic level of the data strobe signal, which is driven by a memory, in accordance with the data read command.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF EMBODIMENTS

Figure 1:
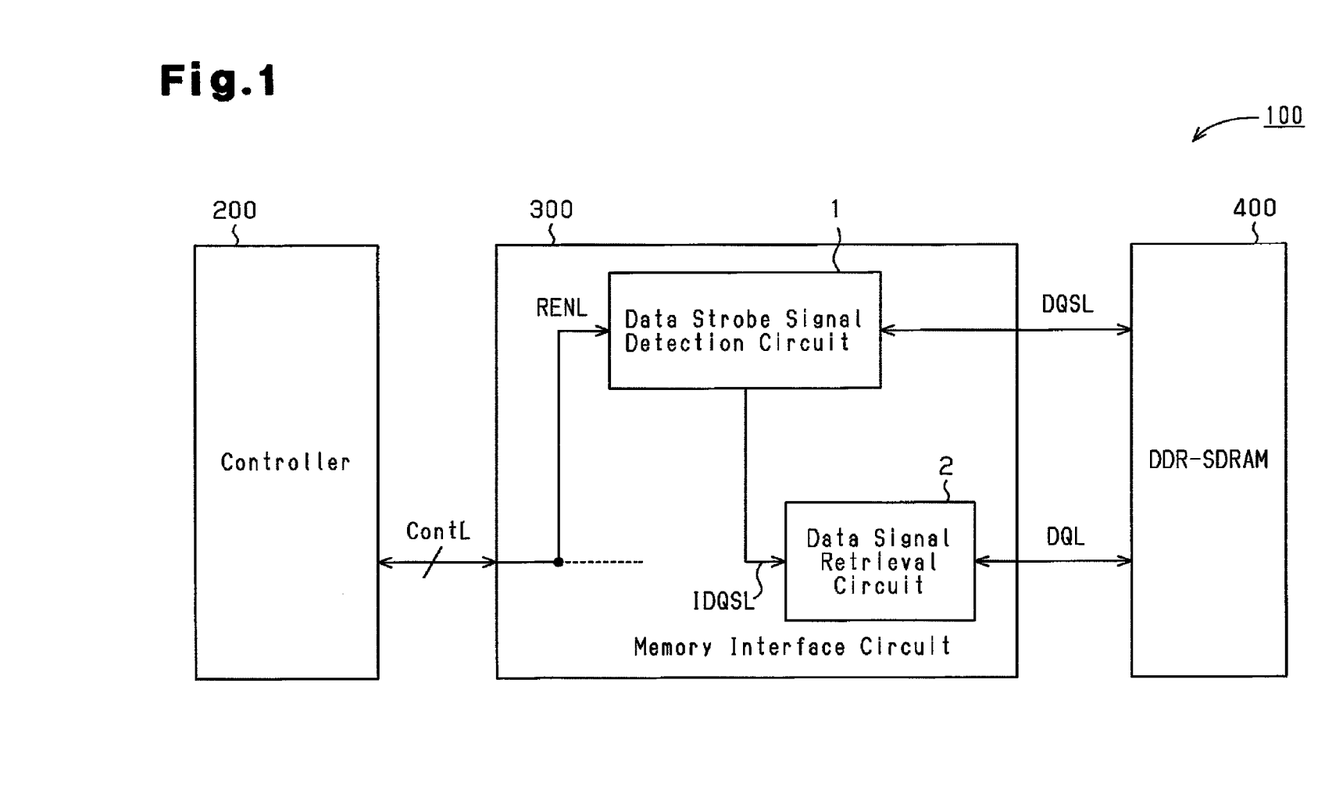
FIG. 1 is a block diagram illustrating an electronic device including a data strobe signal detection circuit.

FIG. 1 is a block diagram of an electronic device 100 including a data strobe signal detection circuit 1. The electronic device 100 includes a controller 200, a memory interface circuit 300, and a DDR-SDRAM 400. The memory interface circuit 300 is coupled to the controller 200 by a plurality of control lines ContL. One of the control lines ContL is a read enable line RENL that instructs the reading of data. The memory interface circuit 300 controls the DDR-SDRAM 400 according to the plurality of control signals Cont output from the controller 200. One of the control signals Cont is a read enable signal REN serving as a data read command. When the memory interface circuit 300 receives the read enable signal REN from the controller 200, the memory interface circuit 300 sends a data read signal (not illustrated) to the DDR-SDRAM 400. The DDR-SDRAM 400 starts reading data in response to the data read signal.

The memory interface circuit 300 is coupled to the DDR-SDRAM 400 by a DQ line DQL and a DQS line DQSL. The data is input and output through the DQ line DQL in synchronization with a clock propagated through the DQS line DQSL. The DDR-SDRAM 400 is a so-called double data rate SDRAM in which data is read or written when a clock, which is synchronized with data, rises and falls. When the memory interface circuit 300 reads data from the DDR-SDRAM 400, the DDR-SDRAM 400 sends read data (hereinafter referred to as DQ signal) to the DQ line DQL in synchronization with a data strobe signal (hereinafter referred to as DQS signal) output to the DQS line DQSL. This propagates the DQ signal in the memory interface circuit 300 in synchronization with the DQS signal. The memory interface circuit 300 delays the DQS signal so that the rising edge and the falling edge of the DQS signal are shifted to the timing that determines the data of the DQ signal. Then, the memory interface circuit 300 retrieves the DQ signal. When writing data to the DDR-SDRAM 400, the memory interface circuit 300 outputs the DQS signal to the DDR-SDRAM 400 through the DQS line DQSL and outputs the DQ signal in synchronization with the DQS signal through the DQ line DQL.

The data strobe signal detection circuit 1 is arranged in the memory interface circuit 300. The data strobe signal detection circuit 1 is coupled to the read enable line RENL to receive the read enable signal REN. Further, the data strobe signal detection circuit 1 is coupled to the DQS line DQSL to receive the DQS signal. The data strobe signal detection circuit 1 delays the rising edge and the falling edge of the DQS signal and outputs an internal data strobe signal IDQS to an internal data strobe line IDQSL. A data signal retrieval circuit 2 is coupled to the internal DQS line IDQSL to receive the internal data strobe signal IDQS. The data signal retrieval circuit 2 is coupled to the DQ line DQSL to receive the DQ signal. The memory interface circuit 300 retrieves the DQ signal with the data signal retrieval circuit 2 based on the internal data strobe signal IDQS.

To retrieve the DQ signal transferred from the DDR-SDRAM 400, the logic level of the DQS signal, which synchronizes the DQ signal, is detected. The DQS signal has a preamble period in which the DQS signal is maintained at low level prior to a toggle period in which the DQ signal is synchronized with the DQS signal. When shifting from the preamble period to the toggle period, the data signal retrieval circuit 2 detects shifting of the DQS signal to a high level to detect the retrieval timing of the DQ signal. The operation period during which the shifting of the DQS signal to a high level is detected is generally referred to as a gating period. For example, in the data strobe signal detection circuit 1, the shifting of the read enable signal REN to a high level starts the gating period. In other words, the gating period in which the logic level of the DQS signal transferred from the DDR-SDRAM 400 is detected starts in accordance with the data read command from the controller 200.

Before the preamble period starts, the data strobe signal detection circuit 1 starts the gating operation at a timing at which the read enable signal REN shifts to a high level, that is, a timing corresponding to the data read command. The DQS line DQSL is not driven by the DDR-SDRAM 400 when the gating operation starts. However, the data strobe signal detection circuit 1 includes a circuit for clamping the DQS line DQSL to the ground potential. Thus, the data strobe signal detection circuit 1 does not detect the DQS line DQSL in a high impedance state during the gating period. Due to manufacturing variations of the DDR-SDRAM 400 and usage conditions such as usage temperature and operational power supply voltage, the period from when the data read command is input until the preamble period is started may vary. However, the DQS line DQSL is clamped to the ground potential. Thus, the DQS line DQSL does not shift to the high impedance state. This prevents unexpected changes in the logic level of the DQS signal when noise and the like affect the DQS line DQSL.

Figure 2:
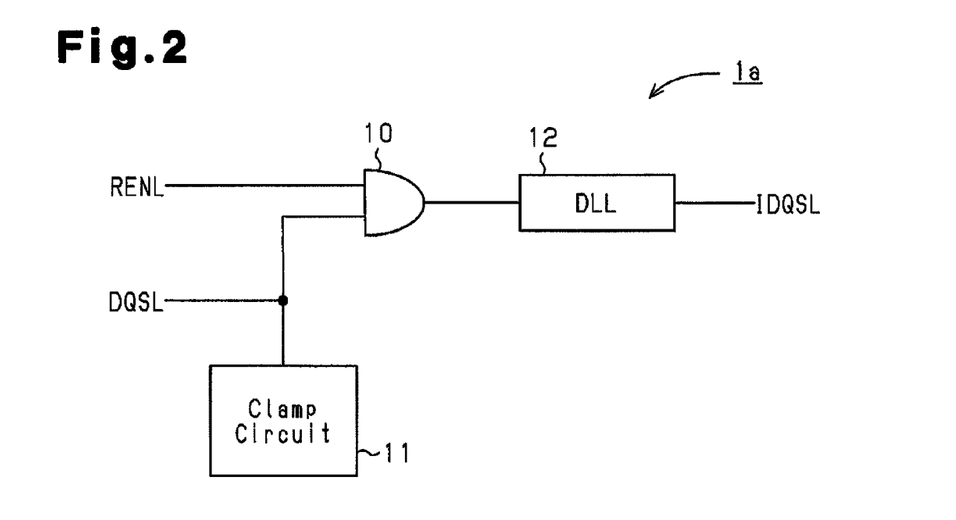
FIG. 2 is a block diagram of a data strobe signal detection circuit in a first embodiment.

FIG. 2 is a block diagram of a data strobe signal detection circuit 1*a* in a first embodiment. The data strobe signal detection circuit 1*a* includes an AND circuit 10, a clamp circuit 11, and a DLL (Delay Locked Loop) circuit 12. The AND circuit 10 has two input terminals and one output terminal. The first input terminal of the AND circuit 10 is coupled to the DQS line DQSL to receive the DQS signal. The second input terminal of the AND circuit 10 is coupled to the read enable line RENL to receive the read enable signal REN. The read enable signal REN starts the gating operation. The output terminal of the AND circuit 10 is coupled to the DLL circuit 12. The clamp circuit 11 is coupled to the DQS line DQSL. Here, the DQS signal is not a differential signal. However, if the DQS signal were to be a differential signal, a BDQS line BDQSL used with the DQS line DQSL may be clamped to the power supply.

The clamp circuit 11 clamps the DQS line DQSL to the ground potential. The clamping is performed irrespective of the propagation delay of the DQS signal. This starts the gating operation and starts in accordance with the shifting of the read enable signal REN to a high level. In at least the initial stage of the gating operation, the DQS line DQSL does not shift to the high impedance state even if the DQS line DQSL is not driven by the DDR-SDRAM 400. The output terminal of the DLL circuit 12 is coupled to the internal DQS line IDQSL to output the internal data strobe signal IDQS. The internal data strobe signal IDQS delays the DQS signal. When reading data from the DDR-SDRAM 400, the DQ signal is output in synchronization with the DQS signal. Accordingly, the internal data strobe signal IDQS is delayed with respect to the DQ signal, which is propagated in synchronization with the DQS signal. The DLL circuit 12 adjusts the delay so that the internal data strobe signal IDQS acts as a trigger signal when the memory interface circuit 300 retrieves the DQ signal. The DLL circuit 12 delays the internal data strobe signal IDQS until a timing at which the time in which the logic level of the DQ signal is determined prior to the edge of the internal data strobe signal IDQS, that is, the setup time of the DQ signal, and the time in which the logic level of the DQ signal is held after the edge of the internal data strobe signal IDQS, that is, the hold time of the DQ signal, are ensured.

Figure 3:
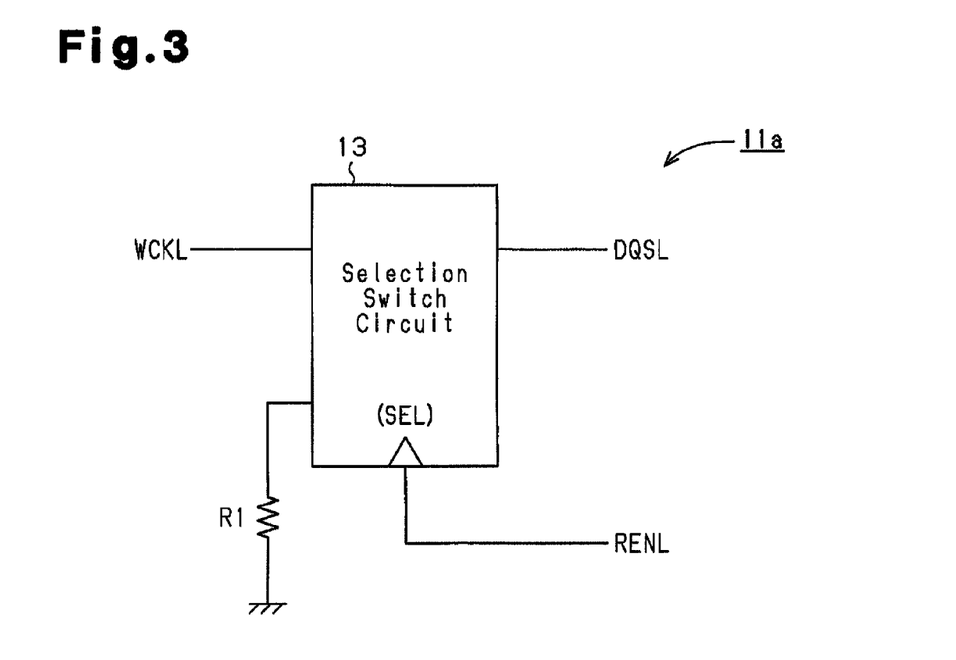
FIG. 3 is a circuit diagram of a clamp circuit 11a, which is a first example of the clamp circuit.

FIG. 3 is a circuit diagram of the clamp circuit 11*a*, which is a first example of the clamp circuit. The clamp circuit 11*a* includes a selection switch circuit 13 and a resistor R1. The selection switch circuit 13, which is coupled to first to third wires, selectively couples the first or second wire to the third wire. The selection switch circuit 13 includes a selection terminal (SEL), which is coupled to the read enable line RENL to receive the read enable signal REN. The selection switch circuit 13 selects either one of the first and second wires in accordance with the logic level of the read enable signal REN. The first wire is a clock line WCKL that propagates the clock signal when writing data. The clock signal when writing data synchronizes the write data. When the clock line WCKL is coupled to the DQS line DQSL, the DQ signal, which is the write data, is propagated to the DDR-SDRAM 400 in synchronization with the DQS signal when writing data. The DQS signal when writing data is a strobe signal that synchronizes the DQ signal, which is the write data.

The second wire coupled to the selection switch circuit 13 is coupled to the ground potential by the resistor R1. The third wire coupled to the selection switch circuit 13 is the DQS line DQSL. When the read enable signal REN has a high level and data is read from the DDR-SDRAM 400, the selection switch circuit 13 selects the second wire, which is coupled to the resistor R1. As a result, the DQS line DQSL is clamped to the ground potential. When the read enable signal REN has a low level and data is written to the DDR-SDRAM 400, the selection switch circuit 13 selects the first wire, that is, the clock line WCKL. As a result, the DQS signal synchronized with the DQ signal, which is the written data, is output.

Figure 4:
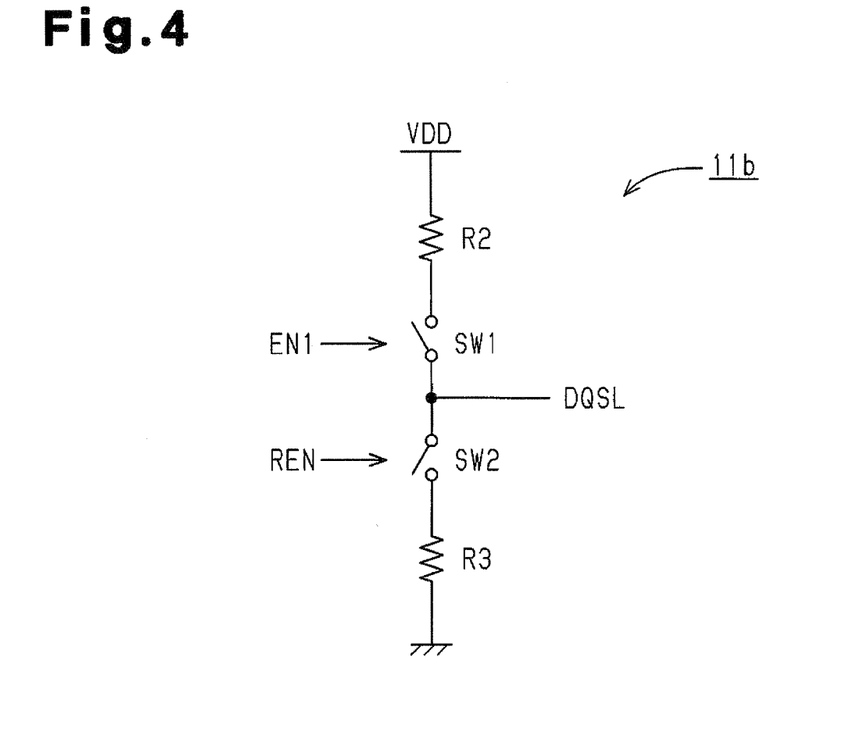
FIG. 4 is a circuit diagram of a clamp circuit 11b, which is a second example of the clamp circuit.

FIG. 4 is a circuit diagram of a clamp circuit 11*b*, which is a second example of the clamp circuit. The clamp circuit 11*b* includes a switch SW1, a switch SW2, a resistor R2, and a resistor R3. The switch SW1 has one end coupled to the DQS line DQSL and another end coupled to the power supply voltage VDD by the resistor R2. The ON/OFF control of the switch SW1 is performed by an enable signal EN1. The switch SW2 has one end coupled to the DQS line DQSL and another end coupled to the ground potential by the resistor R3. The ON/OFF control of the switch SW2 is performed by the read enable signal REN.

Figure 5:
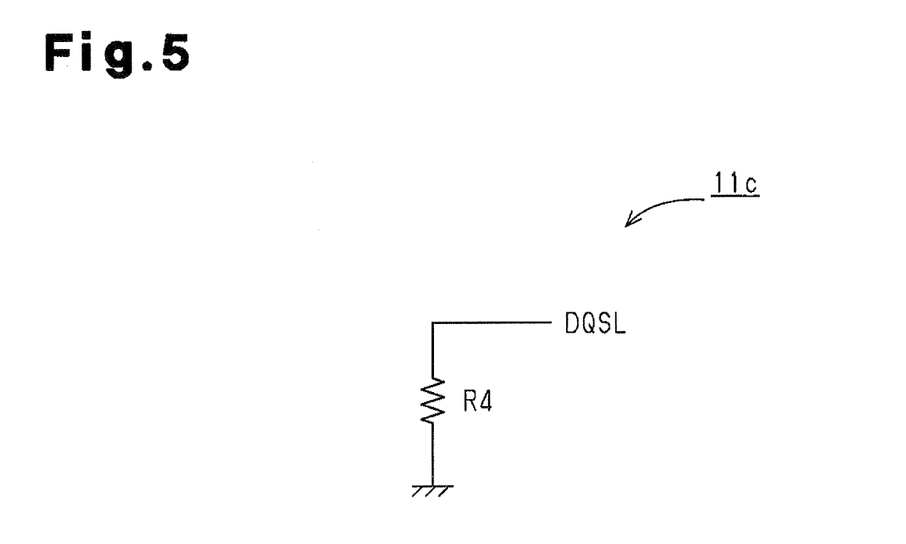
FIG. 5 is a circuit diagram of a clamp circuit 11c, which is a third example of the clamp circuit.

FIG. 5 is a circuit diagram of a clamp circuit 11c, which is a third example of the clamp circuit. The clamp circuit 11c includes a resistor R4. The resistor R4 has one end coupled to the DQS line DQSL and another end coupled to the ground potential.

The operations of the clamp circuits 11a to 11c in the first to third examples will be described below.

In the clamp circuit 11a according to the first example of the first embodiment, when the read enable signal REN output from the controller 200 shifts to a high level, the selection switch circuit 13 selects the resistor R1. This grounds the DQS line DQSL via the resistor R1 and clamps the DQS line DQSL to the ground potential. The clamped state is continued during a period in which the read enable signal REN has a high level, that is, during the period in which data is read from the DDR-SDRAM 400. When the read enable signal REN shifts to a low level, the selection switch circuit 13 selects the clock line WCKL and couples the DQS line DQSL to the clock line WCKL. This sends the DQS signal, which is synchronized with the DQ signal or the write data to the DDR-SDRAM 400, out of the memory interface circuit 300 to the DQS line DQSL.

In the clamp circuit 11b according to the second example of the first embodiment, when the read enable signal REN shifts to a high level, the switch SW2 is in a coupled state. This grounds the DQS line DQSL via the resistor R3 and clamps the DQS line DQSL to the ground potential. The clamped state is continued during a period in which the read enable signal REN has a high level, that is, during the period in which data is read from the DDR-SDRAM 400. When the read enable signal REN shifts to a low level, the switch SW2 opens. This unclamps the DQS line DQSL from the ground potential. When necessary, the switch SW1 becomes conductive due to the enable signal EN1. In this case, the DQS line DQSL is clamped to the power supply voltage VDD by the resistor R2.

In the clamp circuit 11c according to the third example of the first embodiment, the DQS line DQSL is grounded by the resistor R4 and thus clamped to the ground potential. If the DQS signal is a differential signal, the BDQS line BDQSL may be clamped to the power supply voltage VDD.

Figure 6:
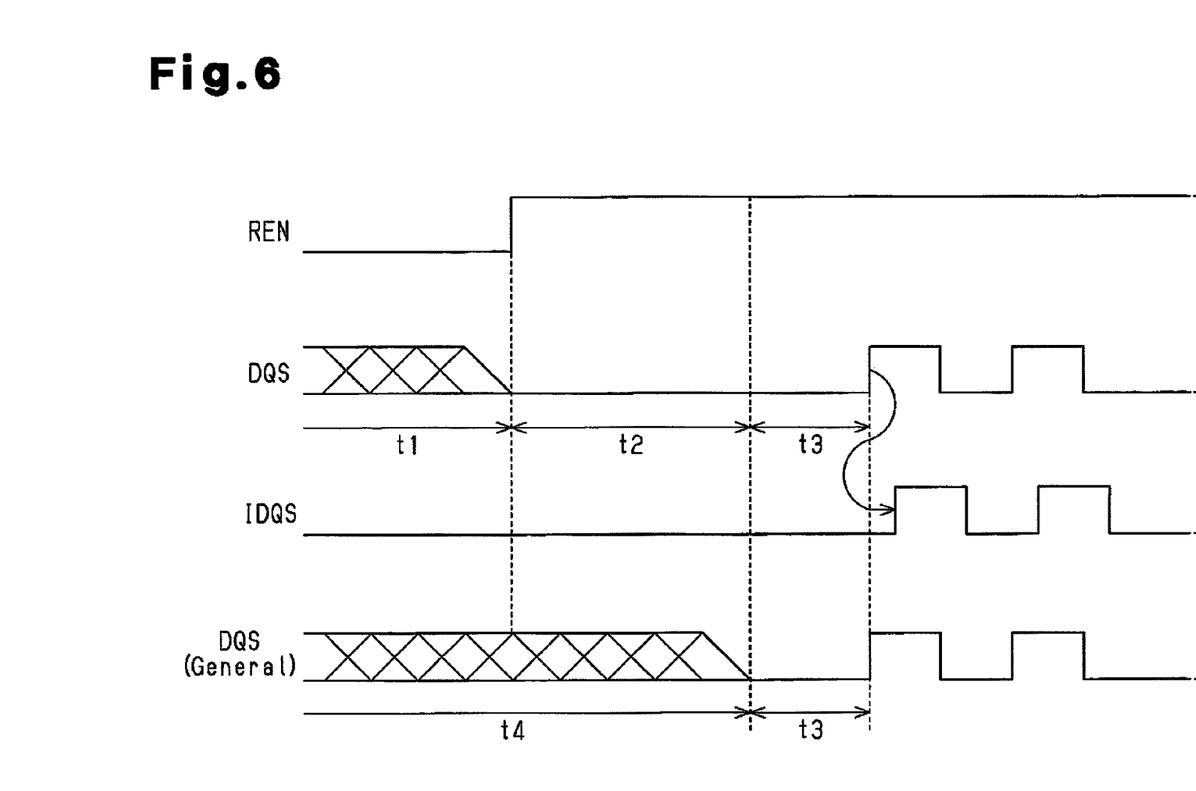
FIG. 6 is a timing chart illustrating the operation of a memory interface circuit in the first embodiment.

The timing for reading data with the data strobe signal detection circuit 1a according to the first embodiment will now be described. FIG. 6 is a timing chart for the first embodiment. The read enable signal REN has a low level during period t1 before a data access command is issued by the controller 200. The DQS signal is in a high impedance state during period t1. During period t1, the output signal of the AND circuit 10 has a low level irrespective of the logical state of the DQS signal. This is because the read enable signal REN has a low level.

Period t2 starts when the access command for data is issued from the controller 200, and the read enable signal REN shifts from low level to high level. Here, if the clamp circuit 11 is the clamp circuit 11a, the DQS line DQSL is clamped to the ground potential via the resistor R1 by the selection switch circuit 13. If the clamp circuit 11 is the clamp circuit 11b, the DQS line DQSL is clamped to the ground potential via the resistor R3 by the switch SW2. If the clamp circuit 11 is the clamp circuit 11c, the DQS line DQSL is clamped to the ground potential via the resistor R4. Thus, even if the DQS line DQSL is not driven by the DDR-SDRAM 400, the charges in the DQS line DQSL are discharged to the ground potential via the resistor R1, R3, or R4. This prevents a floating state of the DQS line DQSL. The DQS line DQSL is maintained at the ground potential during period t2, in which the DQS line DQSL has not been driven and preamble period t3 has not started. In the preamble period t3, the DDR-SDRAM 400 outputs the DQS signal at a low level to the DQS line DQSL. Accordingly, the DQS signal is maintained at low level by the clamp circuit 11a, 11b, or 11c. In the conventional art, the DQS line DQSL is not driven by the DDR-SDRAM 400 and is in a high impedance state (period t4) during period t2.

The capability of the resistor R1, R3, or R4 to extract the charges of the DQS line DQSL to the ground potential, that is, the capability of the clamp circuit 11 to generate current is sufficiently small compared to the capability of the DDR-SDRAM 400, which drives the DQS signal, to generate current. Thus, the DDR-SDRAM 400 may drive the DQS signal to a low level or high level. The DQS signal shifts to a high level after the preamble period in which the logic level is maintained at a low level. When the DQS signal shifts to a high level, the read enable signal REN has a high level. Thus, the output signal of the AND circuit 10 shifts to a high level. When the DQS signal shifts to a low level, the output signal of the AND circuit 10 shifts to a low level. In this manner, the AND circuit 10 outputs a signal having the same phase as the DQS signal. The output signal of the AND circuit 10 is delayed by the DLL circuit 12 and output as the internal data strobe signal IDQS. The memory interface circuit 300 retrieves the DQ signal at the timings of both the rising edge and the falling edge of the internal data strobe signal IDQS.

After the read enable signal REN output from the controller 200 shifts to a high level, in accordance with reading of data from the DDR-SDRAM 400, the DQS signal shifts from the high impedance state, in which it is not driven, to the preamble state, which is a low level, and then to a toggle state. The DQS signal is output as a clock signal in the toggle period. The data strobe signal detection circuit 1 starts the gating operation when the read enable signal REN shifts to the high level. The operational characteristics of the DDR-SDRAM 400 may vary due to manufacturing variations of the DDR-SDRAM 400 and usage conditions such as usage temperature and operational power supply voltage. This may vary the propagation delay time of a signal such as the DQS signal. Even in such a case, the clamping operation starts at the same timing as when gating starts or before gating starts. Thus, the level of the DQS line DQSL does not change during the gating period.

When the clamp circuit 11 is coupled to the DQS line DQSL, the DQS line DQSL is clamped to the ground potential when the read enable signal REN has a high level during a read operation. Thus, the DQS signal is maintained at low level by the clamp circuit 11 even if the DQS line DQSL is not driven (period t2). The DQS line DQSL thus does not change to the high impedance state after the read enable signal REN shifts to a high level. Accordingly, an unexpected rising edge or falling edge is not produced in the DQS line DQSL by noise or the like. Thus, the memory interface circuit 300 thus does not detect an unexpected edge of the DQS signal and does not erroneously detect the DQS signal. As a result, an erroneous DQ signal is not retrieved.

The capability of the clamp circuit 11 to generate current is sufficiently small compared to the capability of a driver (not illustrated) arranged in the DDR-SDRAM 400 to drive the DQS line DQSL and generate current. Thus, when the DDR-SDRAM 400 drives the DQS line DQSL, the DDR-SDRAM 400 may shift the DQS signal from a low level to a high level with a sufficient driving capability. Thus, even if the clamp circuit 11 continues to clamp the DQS line DQSL to the ground potential, the data strobe signal detection circuit 1a may retrieve the shifting of the logic level of the DQS signal without any delay. Accordingly, the data signal retrieval circuit 2 may accurately retrieve the DQ signal with the internal data strobe signal IDQS, which is generated based on the retrieved DQS signal. The clamp circuit 11 may be the clamp circuit 11a illustrated as the first example including the selection switch circuit 13 and the resistor R1, the clamp circuit 11b illustrated as the second example including the switches SW1 and SW2 and the resistors R2 and R3, and the clamp circuit 11c illustrated as the third example including the resistor R4. Accordingly, the clamp circuits 11a, 11b, and 11c are all simple circuits. This allows for reduction of the circuit scale. Further, the control of the clamp circuit 11 is sufficient for switching a switch with the read enable signal REN, and complicated control is not required.

In the foregoing description, the switching control in the clamp circuits 11a and 11b is performed by the read enable signal REN. However, other switching controls may be performed. For example, a Q output terminal of a flip-flop circuit is coupled in lieu of the read enable line RENL in the clamp circuits 11a and 11b. The read enable signal REN is input to a set terminal of the flip-flop circuit, and a signal corresponding to the first shifting of the DQS signal to a high level is input to a reset terminal. The flip-flop circuit thus outputs a high level signal from the Q output terminal when the read enable signal REN shifts to a high level. The flip-flop circuit performs a reset operation when the DQS signal shifts to a high level for the first time, and outputs a low level signal from the Q output terminal. If the DQS signal is a differential signal and not a single-phase signal, the BDQS line BDQSL may be clamped to the power supply voltage VDD.

In this configuration, the clamp circuits 11a and 11b are decoupled from the DQS line DQSL after the preamble period ends and the shifting of the DQS signal to a high level is detected. Thus, when reading data from the DDR-SDRAM 400, the clamp circuits 11a and 11b do not become loads when toggle-driving the DQS signal, and the driving performance of the DQS line DQSL by the DDR-SDRAM 400 may be maintained. Further, the leakage current when the clamp circuits 11a and 11b are coupled may be reduced, and current consumption is not increased.

Figure 7:
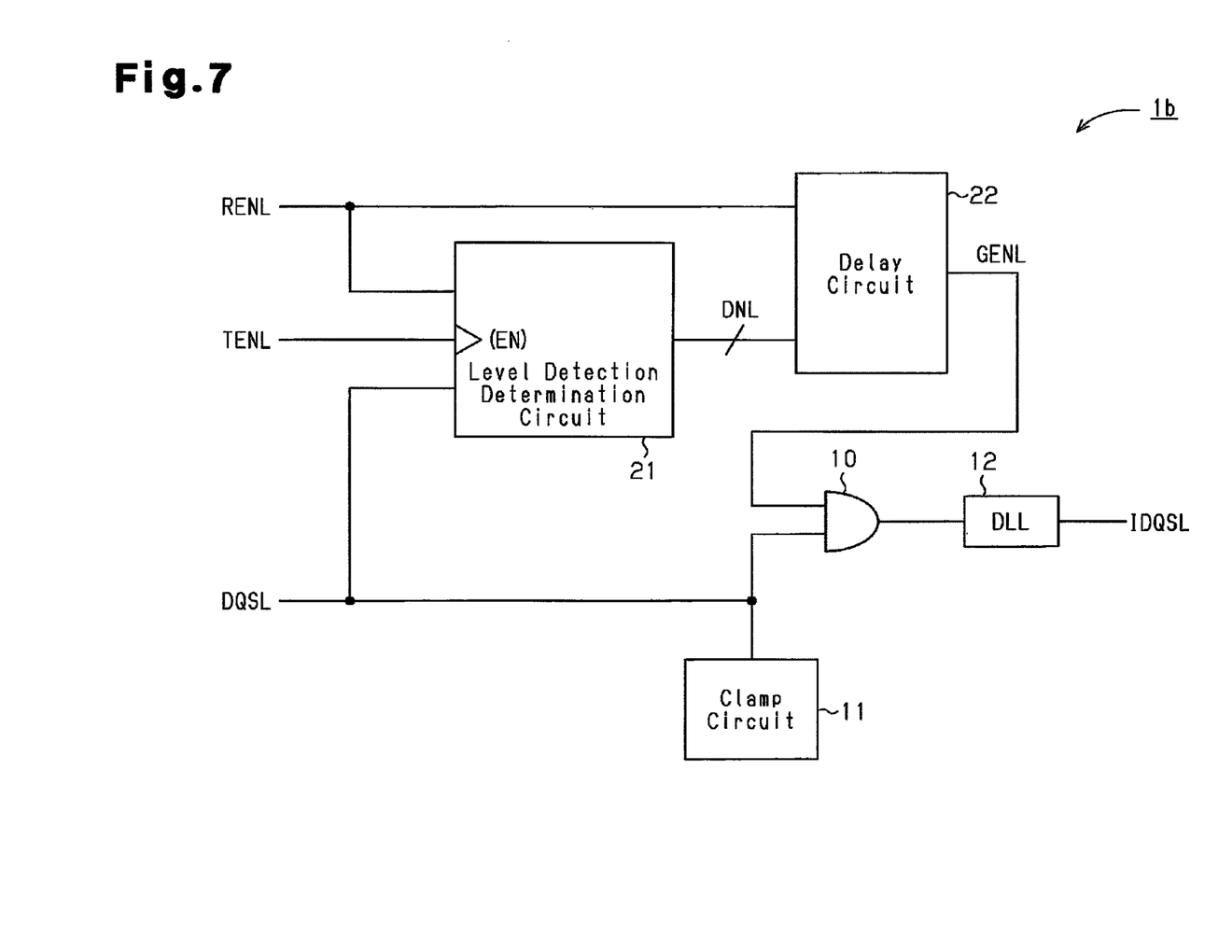
FIG. 7 is a block diagram of a data strobe signal detection circuit in a second embodiment.

FIG. 7 is a block diagram of a data strobe signal detection circuit 1b according to a second embodiment. The data strobe signal detection circuit 1b includes a level detection determination circuit 21, a delay circuit 22, the AND circuit 10, the clamp circuit 11, and the DLL circuit 12.

The level detection determination circuit 21 includes three input terminals and one output terminal. The first input terminal is coupled to the read enable line RENL to receive the read enable signal REN. The second input terminal is an enable terminal (EN) and is coupled to a training enable line TENL to receive a training enable signal TEN. The third input terminal is coupled to the DQS line DQSL to receive the DQS signal. The output terminal is coupled to a delay value line DNL to output a delay value signal DN.

The training enable signal TEN is one of a plurality of control signals Cont output from the controller 200 and controls the operation state and pause state of the level detection determination circuit 21. The delay value signal DN is a signal indicating the time from when the read enable signal REN shifts to a high level to when the DQS signal shifts to a high level during toggle initiation. The level detection determination circuit 21 starts operating in accordance with the training enable signal TEN and measures the time from when the read enable signal REN shifts to a high level to when the DQS signal shifts to a high level.

The delay circuit 22 includes two input terminals and one output terminal. The first input terminal is the enable terminal (EN) and is coupled to the read enable line RENL to input the read enable signal REN. The second input terminal is coupled to the delay value line DNL to input the delay value signal DN. The output terminal is coupled to the gating line GENL to output the gating signal GEN. The delay circuit 22 stores the timing information based on the delay value signal DN as a delay value. During normal operation of the DDR-SDRAM 400, the level detection determination circuit 21 is controlled by the training enable signal TEN to be in the pause state. In other words, the level detection determination circuit 21 is controlled to be operational and generate the delay value signal DN before the normal operation of the DDR-SDRAM 400. In the normal operation of the DDR-SDRAM 400, the delay circuit 22 delays the gating signal GEN in accordance with the delay value (DN) and outputs the gating signal GEN after the read enable signal REN is input.

The AND circuit 10 includes two input terminals and one output terminal. The first input terminal of the AND circuit 10 is coupled to the DQS line DQSL to receive the DQS signal. The second input terminal of the AND circuit 10 is coupled to the gating line GENL to receive the gating signal GEN. The output terminal is coupled to the DLL circuit 12. The clamp circuit 11 is coupled to the DQS line DQSL. The output terminal of the DLL circuit 12 is coupled to the internal data strobe line IDQSL to output the internal data strobe signal IDQS.

The gating signal GEN has a low level when the gating operation is not performed. Accordingly, the AND circuit 10 arranged in the data strobe signal detection circuit 1b maintains the output signal at a low level regardless of the logic level of the DQS signal. When the gating signal GEN shifts to a high level and the starting of the gating operation is instructed, the AND circuit 10 outputs a signal that has the same phase as the input DQS signal to the DLL circuit 12. The DLL circuit 12 delays the output signal of the AND circuit 10 and outputs the internal data strobe signal IDQS.

In an electronic device, the operational characteristics may generally vary due to manufacturing variations and usage conditions such as usage temperature and operational power supply voltage. This varies the propagation delay time.

The data strobe signal detection circuit 1b adjusts the output timing of the gating signal GEN so that the gating operation starts in the preamble period regardless of variations in the propagation delay time of a signal. In the present example, the level detection determination circuit 21 performs the training operation in accordance with the training enable signal TEN prior to the read operation of the DDR-SDRAM 400. Further, the level detection determination circuit 21 sets the timing for starting the gating operation in the preamble period regardless of the variations in the propagation delay time of a signal.

During the training operation, the level detection determination circuit 21 measures the time from when the read enable signal REN shifts to a high level to when the DQS signal shifts to a high level. Then, the level detection determination circuit 21 subtracts the time corresponding to a single clock of the clock signal CK from the measured time to obtain timing information. The timing information is provided to the delay circuit 22 as the delay value signal DN. The delay circuit 22 stores the timing information instructed by the delay value signal DN as the delay time (delay value). The gating signal GEN output from the delay circuit 22 thus shifts to a high level in the preamble period regardless of the variation in the propagation delay time of the signal. For example, the timing for starting the gating operation is set to be earlier than when the DQS signal shifts to a high level by a time shorter than the preamble period. The time that is shorter than the preamble period may be, for example, about one half of the preamble period. The training operation is performed in this manner. The delay time is set in the delay circuit 22 in advance prior to the actual data read operation.

The normal data read operation is performed after the training operation stores the delay time in the delay circuit 22. In the data read operation, the delay circuit 22 outputs the gating signal GEN by delaying the read enable signal REN in correspondence with the delay time stored in the delay circuit 22. The gating operation starts when the gating signal GEN shifts to a high level. The gating signal GEN shifts to a high level in the preamble period. Thus, the gating operation starts in the preamble period in which the DQS line DQSL is driven to a low level.

Figure 8:
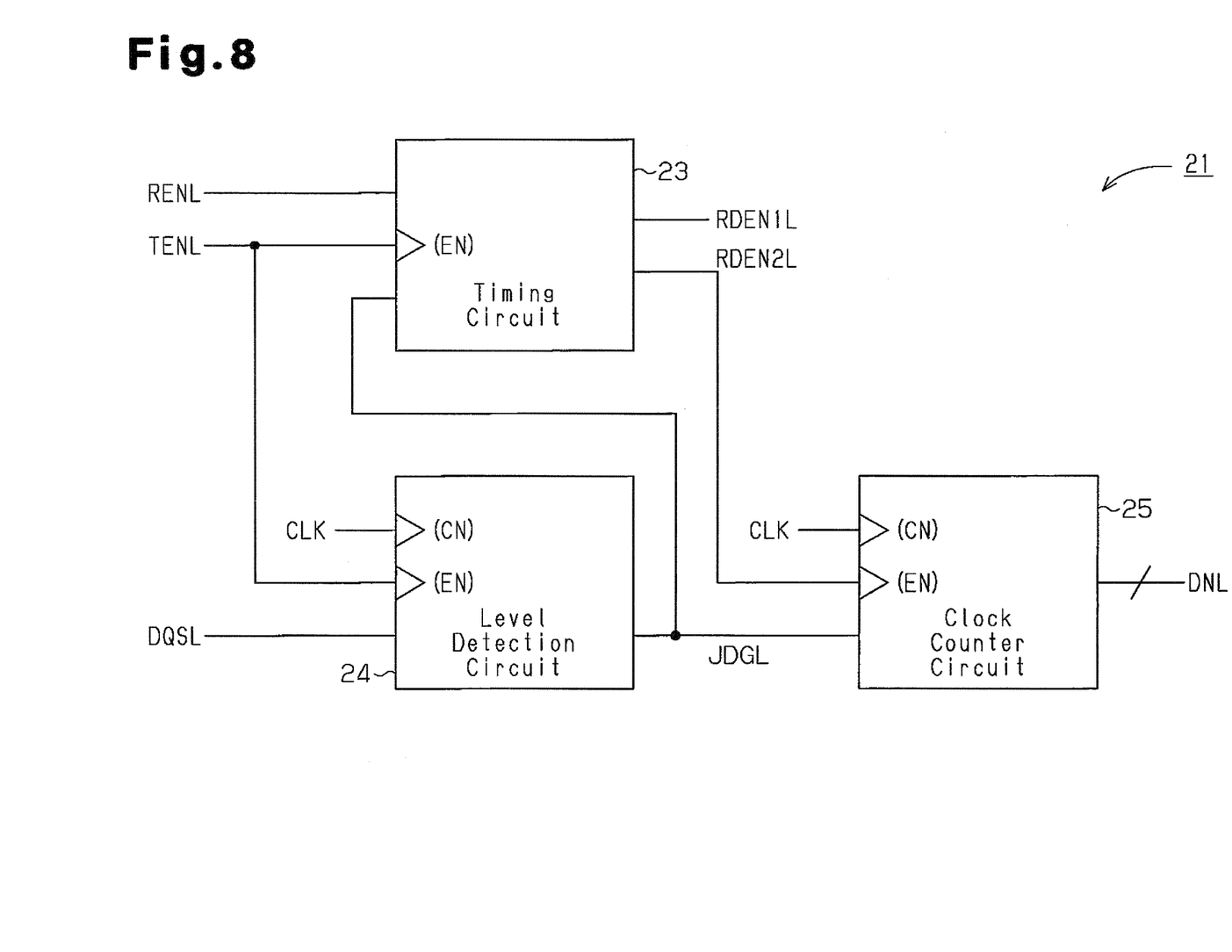
FIG. 8 is a block diagram of a level detection determination circuit.

FIG. 8 is a block diagram of the level detection determination circuit. The level detection determination circuit 21 includes a timing circuit 23, a level detection circuit 24, and a clock counter circuit 25.

The timing circuit 23 includes three input terminals and two output terminals. The first input terminal is coupled to the read enable line RENL to receive the read enable signal REN. The second input terminal is the enable terminal (EN) and is coupled to the training enable line TENL to receive the training enable signal TEN. The third input terminal is coupled to a control line JDGL to receive a control signal JDG. The control signal JDG is the output signal of the level detection circuit 24. The first output terminal of the timing circuit 23 is coupled to a first enable line RDEN1L to output a first enable signal RDEN1. The second output terminal is coupled to a second enable line RDEN2L to output a second enable signal REDN2.

The first enable signal REDN1 is a control signal that shifts to a high level at the same phase as when the read enable signal REN shifts to a high level. The first enable signal RDEN1 is provided to the clamp circuit 11. In the case of the clamp circuit 11a, the first enable signal RDEN1 is used in lieu of the read enable signal REN. After the first enable signal RDEN1 shifts to a high level, the DQS line DQSL is clamped to the ground potential via the resistor R1. In the case of the clamp circuit 11b, the first enable signal RDEN1 is used in lieu of the read enable signal REN. After the first enable signal RDEN1 shifts to a high level, the DQS line DQSL is clamped to the ground potential via the resistor R3.

The second enable signal REDN2 is a control signal that shifts to a high level one cycle after the read enable signal REN shifts to a high level. The second enable signal REDN2 shifts to a low level when the control signal JDG shifts to a high level.

The level detection circuit 24 includes three input terminals and one output terminal. The first input terminal is a clock terminal (CK) and is coupled to the clock line CKL to receive the clock signal CK. The second input terminal is the enable terminal (EN) and is coupled to the training enable line TENL to receive the training enable signal TEN. The third input terminal is coupled to the DQS line DQSL to receive the DQS signal. The output terminal of the level detection circuit 24 is coupled to the control line JDGL to output the control signal JDG.

The clock signal CK is a clock having a cycle that is one half of the DQS signal output from the DDR-SDRAM 400. The control signal JDG is a signal that shifts to a high level when the clock signal shifts to a high level during a period in which the DQS signal has a high level.

The clock counter circuit 25 includes three input terminals and one output terminal. The first input terminal is the clock terminal (CK) and is coupled to the clock line CKL to receive the clock signal CK. The second input terminal is the enable terminal (EN) and is coupled to the second enable line RDEN2L to receive the second enable signal RDEN2. The third input terminal is coupled to the control signal line JDGL to receive the control signal JDG. The output terminal of the clock counter circuit 25 is coupled to the delay value line DNL and outputs the delay value signal DN. The clock counter circuit 25 starts counting rising edges of the clock signal CK when the second enable signal REDN2 shifts to a high level. The clock counter circuit 25 ends the counting when the control signal JDG shifts to a high level. The count number is output as the delay value signal DN.

Figure 9:
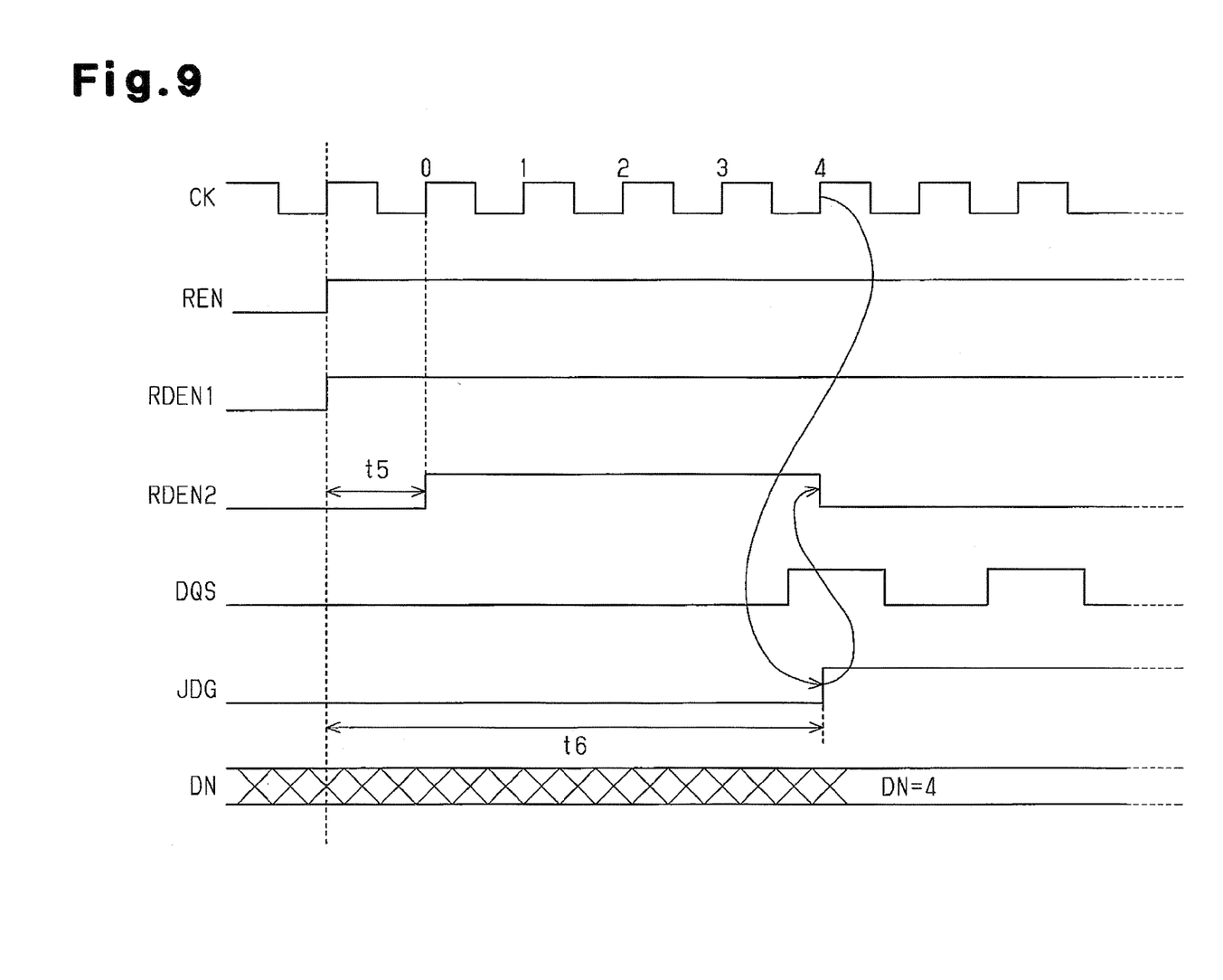
FIG. 9 is a timing chart illustrating the operation of the level detection determination circuit.

The operation for setting the timing to start the gating operation, namely, the training operation, performed by the level detection determination circuit 21 according to the second embodiment will now be described. FIG. 9 is a timing chart illustrating the operation of the level detection determination circuit 21. The training operation is enabled in response to the training enable signal TEN. The read enable signal REN has a low level before the data read command is issued from the controller 200. The DQS line DQSL is not driven and is in the high impedance state. Accordingly, the first enable signal RDEN1, the second enable signal RDEN2, and the control signal JDG each have a low level. The delay value signal DN is an indefinite value.

The read enable signal REN shifts to a high level in synchronization with when the clock signal CK shifts to a high level. The first enable signal RDEN1 shifts to a high level when the read enable signal REN shifts to a high level.

When the first enable signal RDEN1 is input to the clamp circuit 11a, the first enable signal RDEN1 is input to the selection terminal (SEL) of the selection switch circuit 13. When the first enable signal RDEN1 has a high level, the DQS line DQSL is coupled via the resistor R1 and clamped to the ground potential.

When the first enable signal RDEN1 is input to the clamp circuit 11b, the ON/OFF control of the switch SW2 is performed by the first enable signal RDEN1. When the first enable signal RDEN1 has a high level, the switch SW2 becomes conductive and the DQS line DQSL is clamped to the ground potential via the resistor R3.

The second enable signal RDEN2 shifts to a high level after a single clock (period t5) from when the read enable signal REN shifts to a high level. The clock counter circuit 25 starts counting the rising edges of the clock signal CK when the second enable signal RDEN2 shifts to the high level. When detecting the shifting of the clock signal to a high level during a high level period of the DQS signal, the level detection circuit 24 sets the control signal JDG to a high level. In FIG. 9, period t6 is from when the read enable signal REN shifts to a high level to when the control signal JDG shifts to a high level. The clock counter circuit 25 ends the counting of the rising edges of the clock signal when the control signal JDG shifts to a high level. The value counted by the clock counter circuit 25 is output as the delay value signal DN.

In FIG. 9, the clock counter circuit 25 counts four rising edges of the clock signal CK. The timing information indicates the time obtained by subtracting the time (period t5) for a single clock of the clock signal CK from the time of period t6. Thus, the value of the delay value signal DN is four. The timing circuit 23 sets the second enable signal RDEN2 to a low level when the control signal JDG shifts to a high level.

Figure 10:
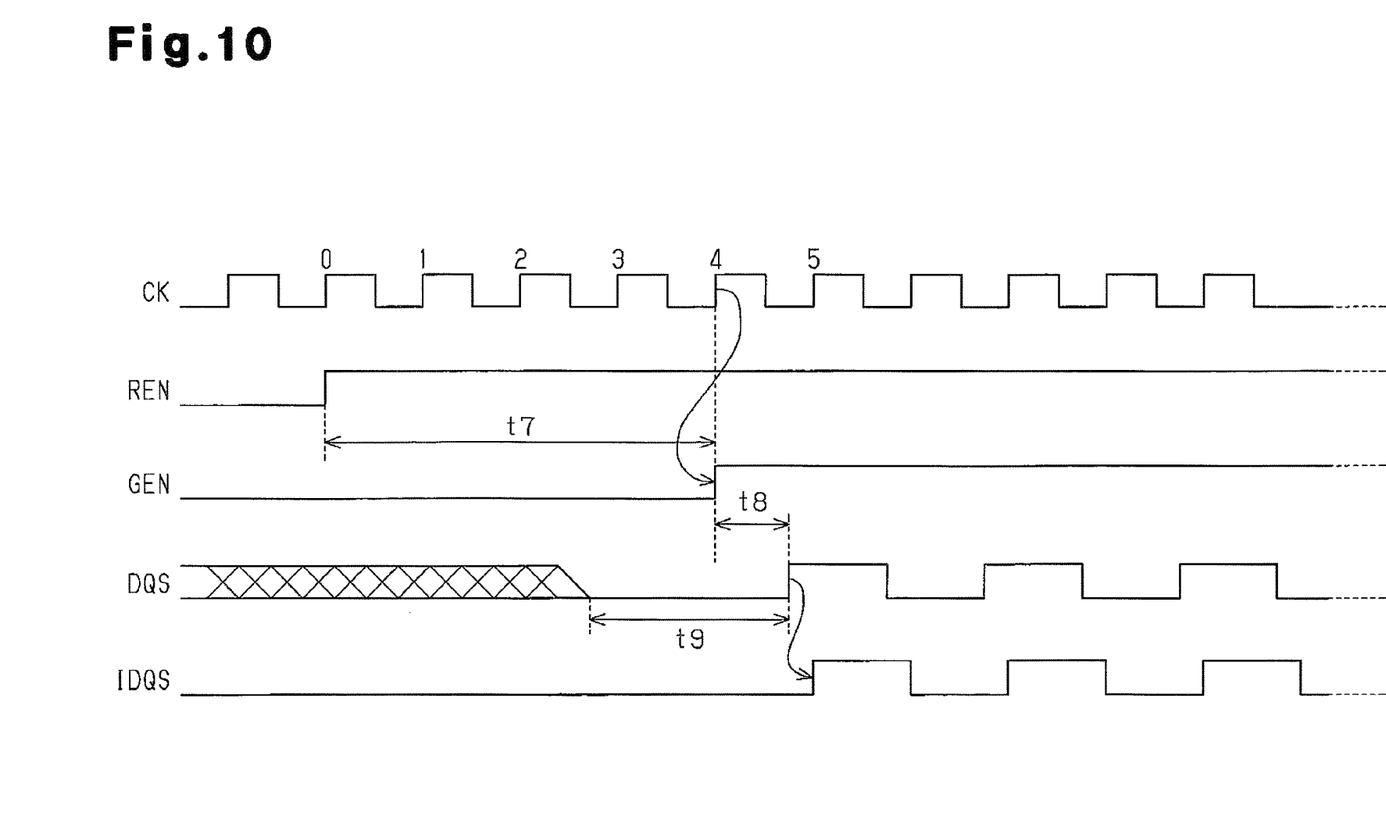
FIG. 10 is a timing chart illustrating the operation of the memory interface circuit in the second embodiment.

The reading of the data strobe signal detection circuit 1b according to the second embodiment will now be described.

FIG. 10 is a timing chart of the read operation in the second embodiment. In the read operation, the training enable signal TEN is in a disenabled state. During this period, the timing circuit 23 is in an operational pause state. Thus, the first enable signal RDEN1 and the second enable signal RDEN2 remain at a low level even if the read enable signal REN shifts to a high level. In the same manner, the level detection circuit 24 is in the operation pause state. Thus, the control signal JDG is maintained at a low level regardless of the shifting of the DQS signal to a high level. The delay value signal DN, which is stored in the delay circuit 22 during the training operation, is held.

The read enable signal REN has a low level before the data read command is issued from the controller 200. Accordingly, the DQS line DQSL is not driven and is in the high impedance state.

In FIG. 10, the read operation from the DDR-SDRAM 400 starts when the data read command is issued from the controller 200 and the read enable signal REN shifts to a high level. The read enable signal REN is input to the delay circuit 22. The delay circuit 22 delays the read enable signal REN with the delay time stored during the training operation. Accordingly, the timing at which the read enable signal REN shifts to a high level is also delayed in accordance with the delay time. In FIG. 10, the delay time is 4, which corresponds to the delay value signal DN output from the level detection circuit 24 during the training operation.

The delay circuit 22 measures the delay time t7 corresponding to the delay value signal DN from when the read enable signal REN shifts to a high level. In FIG. 10, the delay time t7 ends when a rising edge of the clock signal CK is counted four times. This shifts the gating signal GEN to a high level.

The delay time is a value of the delay value signal DN, which is measured in the training operation, and is obtained by subtracting the time corresponding to a single clock of the clock signal CK from the time from when the read enable signal REN shifts to a high level to when the DQS signal shifts to a high level. Accordingly, the timing at which the gating signal GEN shifts to a high level during the read operation is one clock of the clock signal CK before the timing at which the clock signal CL shifts to a high level after the DQS signal shifts to a high level during the training operation (end timing of period t6 in FIG. 9).

The cycle of the clock signal CK is one half the toggle cycle of the DQS signal. Thus, the period in which the DQS signal has a high level corresponds to one cycle of the clock signal CK. Thus, period t8 from when the gating signal GEN shifts to a high level and starts the gating operation to when the DQS signal ends the preamble period and shifts to a high level is, at maximum, a time corresponding to one clock of the clock signal CK before toggle initiation of the DQS signal.

As a result, the timing for starting the gating operation is the latter half of the preamble period t9. The timing for starting the gating operation is in the preamble period of the DQS signal even if the operational characteristics may generally vary due to manufacturing variations and usage conditions, such as usage temperature and operational power supply voltage, and the propagation delay time varies.

The reading of data from the DDR-SDRAM 400 starts after the read enable signal REN output from the controller 200 shifts to a high level. When the propagation delay time of the signal varies, the gating operation may start in the high impedance state in which the DQS line DQS L is not driven if the timing at which the gating operation starts is fixed. The timing for starting the gating operation is set in the preamble period in which the DQS signal has a low level to prevent the retrieval of the DQS signal during the high impedance period.

Accordingly, the training operation that sets the timing for starting the gating operation is performed before the read operation of the DDR-SDRAM 400. In the training operation, the level detection determination circuit 21 detects the period from one clock of the clock signal after when the read enable signal REN shifts to a high level to when the first DQS signal shifts to a high level. Then, the level detection determination circuit 21 outputs the delay value signal DN corresponding to the detection result to the delay circuit 22. The delay value signal DN represents the delay value obtained by subtracting the time of a maximum of one clock of the clock signal CK from the time from when the read enable signal REN shift to a high level to when the DQS signal shifts to a high level. The delay circuit 22 stores the delay value represented by the delay value signal DN.

Thus, the timing for starting the gating operation is set to a timing that is, at maximum, one half of a cycle before a toggle cycle of the DQS signal from the timing at which the DQS signal shifts to a high level. That is, the timing for starting the gating operation is set in the preamble period during the read operation.

As a result, the gating operation does not start when the DQS line DQSL is in the high impedance state during the read operation even if the propagation delay time of the signal varies. Thus, erroneous detection of the logic level of the DQS line DQSL due to noise or the like in the high impedance state does not occur.

When the gating signal GEN shifts to a high level in the preamble period, the toggle signal of the DQS signal may be accurately retrieved into the interface circuit 300 when the DQS signal shifts to a high level after the preamble period ends.

Further, the delay value is stored by performing the training operation once. Thus, the gating operation may be performed at an accurate timing in the subsequent read operation.

In the foregoing description, the switching control in the clamp circuits 11a and 11b is described as being performed by the first enable signal RDEN1 in the training operation. However, other switching controls may be performed. For example, in the clamp circuits 11a and 11b, the Q output terminal of the flip-flop circuit is coupled to the selection switch circuit 13 for controlling the connection of the clamping resistor R1 or resistor R3 or to the control line of the SW2. The read enable signal REN or the first enable signal RDEN1 is provided to the set terminal of the flip-flop circuit. A signal corresponding to the shifting of the DQS signal to a high level after the preamble period ends is provided to the reset terminal of the flip-flop circuit. Thus, the flip-flop circuit outputs a high level signal from the Q output terminal in accordance with the high level shifting of the read enable signal REN or the first enable signal RDEN1. Further, the reset operation is performed when the DQS signal first shifts to a high level, and the Q output terminal outputs a low level signal.

In this configuration, the clamp circuits 11a and 11b are decoupled from the DQS line DQSL after the preamble period ends and shifting of the DQS signal to a high level is detected. Thus, the clamp circuits 11a and 11b do not become loads in the toggle drive of the DQS signal when data is read from the DDR-SDRAM 400, and the driving performance of the DQS line DQSL from the DDR-SDRAM 400 may be maintained. Further, the leakage current resulting from connection of the clamp circuits 11a and 11b is reduced, and the current consumption does not increase during the training operation.

As described above in detail, in the configuration of the present application, the signal level shifting of the data strobe signal is not erroneously detected when the data strobe signal is in the high impedance state. This prevents erroneous retrieval of the read data signal and allows for stable reading of data from the memory.

In the first embodiment, the clamp circuit 11 is arranged in the DQS line DQSL to clamp the DQS line DQSL to the ground potential in the read operation. Thus, the DQS line DQSL is not maintained in a high impedance state in an unexpected manner, and unexpected edges generated in the DQS line DQSL due to noise or the like are not detected. The DQS signal is not erroneously detected, and an erroneous DQ signal is not retrieved.

The clamp circuits 11 illustrated as the first example to the third example are all simple circuits. This reduces the circuit scale of the memory interface circuit 300 including the data strobe signal detection circuit 1. The clamp control by the controller 200 is sufficient for performing a switching operation with the read enable signal REN or the first enable signal RDEN1, and complicated control is not required.

In the second embodiment, the training operation for setting the start timing of the gating operation is performed before the read operation of the DDR-SDRAM 400. The delay value (delay value signal DN) is obtained by subtracting one clock from the number of clocks of the clock signal CK corresponding to the period from when the read enable signal REN shifts to a high level and when the DQS signal shifts to a high level. The delay circuit 22 stores the value of the delay value signal DN. Thus, the timing for starting the gating operation may be set in the preamble period. Further, the delay value is stored by performing the training operation once. Thus, the gating operation may be performed at an accurate timing in the subsequent read operation. The other effects and advantages are similar to those of the first embodiment.

It should be apparent to those skilled in the art that the aforementioned embodiment may be embodied in many other forms without departing from the spirit or scope of the invention. Particularly, it should be understood that the aforementioned embodiment may be embodied in the following forms.

The aforementioned embodiment may be used in a memory device that adopts a differential clock using a DQS signal as the data strobe signal and a BDQS signal, of which the phase differs by 180° from the DQS signal. In this case, the BDQS line BDQSL for outputting the BDQS signal is clamped to the power supply voltage VDD by the clamp circuit 11.

The level detection circuit 24 may operate asynchronously with the clock signal CK as long as it is a circuit capable of detecting shifting of the DQS signal to a high level. In this case, the level detection circuit 24 sets the control signal JDG to a high level when detecting a rising edge of the DQS signal. The clock counter circuit 25 ends the counting of the rising edges of the clock signal CK when the control signal JDG shifts to a high level. The value of the delay value signal DN is smaller by "1" compared to the second embodiment. Two methods may be adopted to correct such reduction. In the first method, "1" is added to the initial value of the clock counter circuit 25. In this case, the clock counter circuit 25 starts counting from the initial value "1". In the second method, "1" is added to the value of the delay value signal DN when storing the value of the delay value signal DN in the delay circuit 22. In the second embodiment, it is obvious that other methods may be adopted as long as the gating operation starts during the preamble period.

The DDR-SDRAM 400 is one example of a memory, the read enable signal REN is one example of a data read command, the DQS signal is one example of a data strobe signal, the low level is one example of a first logic level, the high level is one example of a second logic level, the data signal retrieval circuit 2 is one example of a detection circuit, the level detection determination circuit 21 is one example of a timing circuit, and the AND circuit 10 and the DLL circuit 12 form one example of a gating circuit.

All examples and conditional language recited herein are intended for pedagogical purposes to aid the reader in understanding the principles of the invention and the concepts contributed by the inventor to furthering the art, and are to be construed as being without limitation to such recited examples and conditions, nor does the organization of such examples in the specification relate to a showing of the superiority and inferiority of the invention. Although the embodiments have been described in detail, it should be understood that the various changes, substitutions, and alterations could be made hereto without departing from the spirit and scope of the invention.

The invention claimed is:

1. A memory interface circuit comprising:
   a gating circuit that starts detection of a logic level of a data strobe signal in accordance with a data read command;
   a clamp circuit that clamps the data strobe signal to a first logic level after the data read command is issued; and
   a detection circuit that detects a logic level of the data strobe signal, which is driven by a memory, in accordance with the data read command, wherein
   the gating circuit includes a first input terminal that receives the data read command and a second input terminal that receives the data strobe signal, and
   the clamp circuit is coupled to the second input terminal of the gating circuit to clamp the data strobe signal to the first logic level.

2. The memory interface circuit according to claim 1, further comprising:
   a timing circuit that measures a time from when the data read command is issued in a training period to when the data strobe signal shifts from the first logic level to a second logic level; and
   a delay circuit that holds a delay time, which is shorter by a given time than the time measured by the timing circuit, wherein
   the timing circuit and the delay circuit operate in response to the data read command issued in the training period, and
   when the gating circuit performs a data read operation in accordance with the data read command, the gating circuit starts the detection of the logic level of the data strobe signal in accordance with the delay time.

3. The memory interface circuit according to claim 2, wherein the given time is shorter than a period in which the data strobe signal is driven to the first logic level before a period in which the data strobe signal is toggled in the data read operation.

4. The memory interface circuit according to claim 2, wherein the timing circuit is enabled by a training enable signal in the training period and disabled by the training enable signal during the data read operation.

5. The memory interface circuit according to claim 2, wherein the timing circuit includes
   a timing circuit that generates a first enable signal and a second enable signal from the data read command, and
   a clock counter circuit that measures the delay time based on the second enable signal and a clock signal, wherein the clamp circuit clamps the data strobe signal to the first logic level in accordance with the first enable signal.

6. The memory interface circuit according to claim 5, wherein the second enable signal is delayed by the given time from the first enable signal.

7. The memory interface circuit according to claim 1, wherein the clamp circuit starts a clamping operation in accordance with the data read command.

8. The memory interface circuit according to claim 7, wherein the gating circuit starts the detection of the logic level of the data strobe signal after the clamp circuit starts the clamping operation.

9. The memory interface circuit according to claim 8, wherein the clamp circuit cancels the clamping operation in response to detecting shifting of the data strobe signal from the first logic level to a second logic level.

10. The memory interface circuit according to claim 1, wherein the clamp circuit includes a switch that clamps the data strobe signal to the first logic level in response to the data read command.

11. A memory interface method comprising:
   clamping a data strobe signal to a first logic level after a data read command is issued; and
   starting detection of a logic level of the data strobe signal, which is driven by a memory, in accordance with the data read command, wherein
   the data read command is input to a first input terminal of a gating circuit, the data strobe signal is input to a second input terminal of the gating circuit, and the data strobe signal is clamped to the first logic level by a clamp circuit coupled to the second input terminal of the gating circuit.

12. The memory interface method according to claim 11, further comprising:
   measuring a time from when the data read command is issued in a training period to when the data strobe signal shifts from the first logic level to a second logic level;
   storing a delay time that is shorter than the measured time by a given time; and
   starting the detection of the logic level of the data strobe signal in accordance with the delay time when performing a data read operation in accordance with the data read command.

13. An electronic device comprising:
a controller;
a memory; and
a memory interface circuit arranged between the controller and the memory, wherein the memory interface circuit accesses the memory in accordance with a command from the controller and includes
   a gating circuit that starts detection of a logic level of a data strobe signal in accordance with a data read command from the controller,
   a clamp circuit that clamps the data strobe signal to a first logic level after the data read command is issued, and
   a detection circuit that detects a logic level of the data strobe signal, which is driven by the memory, in accordance, with the data read command, wherein
   the gating circuit includes a first input terminal that receives the data read command and a second input terminal that receives the data strobe signal, and
   the clamp circuit is coupled to the second input terminal of the gating circuit to clamp the data strobe signal to the first logic level.

14. The electronic device according to claim 13, wherein the memory interface circuit further includes
   a timing circuit that measures a time from when the controller issues the data read command in a training period to when the data strobe signal shifts from the first logic level to a second logic level, and
   a delay circuit that holds a delay time, which is shorter by a given time than the time measured by the timing circuit, wherein
   the timing circuit and the delay circuit operate in response to the data read command issued in the training period, and
   when the gating circuit performs a data read operation in accordance with the data read command, the gating circuit starts the detection of the logic level of the data strobe signal in accordance with the delay time.

* * * * *